United States Patent [19]

Horvat

[11] Patent Number: 4,856,085
[45] Date of Patent: Aug. 8, 1989

[54] FM RECEIVER WITH IMPROVED ADJACENT-CHANNEL REJECTION

[75] Inventor: Philippe Horvat, Vieux Thann, France

[73] Assignee: U.S. Philips Corporation, New York, N.Y.

[21] Appl. No.: 28,936

[22] Filed: Mar. 23, 1987

[30] Foreign Application Priority Data

Mar. 21, 1986 [FR] France .................................. 86 04077

[51] Int. Cl.$^4$ .......................................... H04B 15/00
[52] U.S. Cl. .................................... 455/315; 455/209; 455/316; 331/22
[58] Field of Search ........................ 455/315–317, 455/182, 192, 206, 207, 209, 260, 264, 284; 331/22

[56] References Cited

U.S. PATENT DOCUMENTS

| | | | |
|---|---|---|---|
| 4,198,604 | 4/1980 | Holdaway | 331/22 |
| 4,395,777 | 7/1983 | Oki et al. | 455/316 |
| 4,451,930 | 5/1984 | Chapman et al. | 455/316 |
| 4,603,304 | 7/1986 | Burns et al. | 331/22 |
| 4,653,117 | 3/1987 | Heck | 455/316 |

Primary Examiner—Robert L. Griffin
Assistant Examiner—Curtis Kuntz
Attorney, Agent, or Firm—David R. Treacy

[57] ABSTRACT

An FM receiver having a phase-locked loop demodulator and a control voltage correction circuit for the local tuning oscillator. The correction circuit includes a comparator for comparing the output frequency of the phase-locked loop demodulator with the output signal from a reference oscillator, the output of the comparator being connected through an integrator to provide a control signal for the local oscillator as part of an automatic frequency control loop. The comparator output is also fed through an integrator to an adder connected between the demodulator output and the demodulator oscillator controlled input, for setting the demodulator oscillator at the center intermediate frequency when no carrier signal is being received.

2 Claims, 1 Drawing Sheet

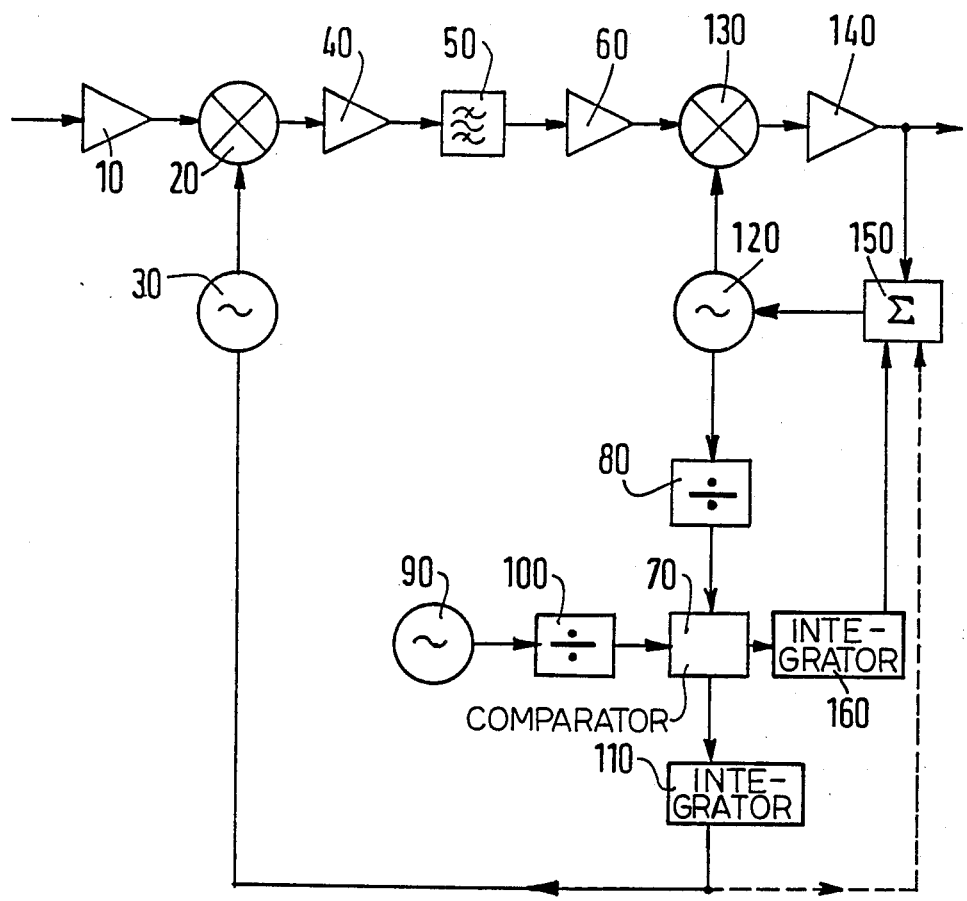

FM RECEIVER WITH IMPROVED ADJACENT-CHANNEL REJECTION

BACKGROUND OF THE INVENTION

The invention relates to a receiver for frequency modulated signals comprising a channel selection and intermediate frequency circuit; a phase-locked loop (PLL) frequency demodulator; and a return lead to the channel selection circuit, constituting a frequency-locked loop for the local tuning oscillator of the selection and IF circuit.

Such a receiver is known, for example from British patent application GB-A-2079552, to which U.S. Pat. No. 4,399,560 corresponds. The receiver described in this document uses three distinct phase detectors for determining a correction signal, with two detectors contributing to the formation of this correction signal and the third detector controlling the supply of this signal to the channel selection circuit. The control inputs of the local tuning oscillator and the phase-locked-loop demodulator oscillator are switched between a start-up mode and a locked-on mode. In the start-up mode the first phase detector controls the demodulator oscillator, and the tuning oscillator is controlled from a resistor network. In the locked on mode, the first detector controls the tuning oscillator, and another resistive network control the modulator oscillator's average frequency.

SUMMARY OF THE INVENTION

The object of the invention is to provide an FM receiver which has a simpler structure and operation than that of the known receiver described in U.S. Pat. No. 4,399,560 and nevertheless provides a relatively narrow capture range of the carrier.

According to the invention, such a receiver comprises a control voltage correction stage including a comparator for signals supplied from the oscillator of the phase-locked demodulator loop and from a reference oscillator. The output of the comparator is fed to at least one integrator. One integrator output is connected to an input of the local tuning oscillator of the frequency-locked loop. Another integrator output is fed to an adder arranged in the phase-locked demodulator loop between the output of the demodulator and the oscillator of the phase-locked loop.

In the receiver according to the invention, the structure is much simpler because no switching actions are required for proper capture, in contrast with the receiver described in U.S. Pat. No. 4,399,560 in which switched resistive networks deliver the control voltage to one or the other of the oscillators. Reduction of the capture range is obtained by adjusting the center frequency of the PLL "centration" frequency demodulator to the intermediate frequency, in the absence of the carrier, by comparing the demodulator oscillator frequency with a reference frequency. The frequency locked loop is disabled when the PLL demodulator, which has a relatively small capture range, has not yet locked.

BRIEF DESCRIPTION OF THE DRAWING

The sole FIGURE is a schematic block diagram of an FM receiver according to the invention.

DESCRIPTION OF THE PREFERRED EMBODIMENT

The receiver for frequency modulated signals shown in the drawing includes a channel selection and intermediate frequency circuit, a phase-locked loop frequency demodulator, and a control voltage correction stage.

The channel selection and IF circuit comprises a mixer 20 whose inputs are connected to an amplifier 10 receiving an incoming signal which is frequency modulated about a given carrier frequency which typically is one of a series of evenly spaced frequencies corresponding to adjacent channels, and a local oscillator 30 tunable over a range corresponding to these channels. The oscillator output is subsequently coupled through an amplifier 40, a band-pass filter 50 and an automatic gain controlled amplifier 60, arranged in series, to the demodulator. The PLL comprises a mixer 130 receiving the output signal of the channel selection and IF circuit at one input, and the output of a voltage controlled oscillator 120 at the other input, and a loop filter 140 for amplifying and processing the mixer 130 output. The demodulator loop is closed through a first input and the output of an adder 150.

The control voltage correction stage, including elements 70 to 110 and 150 and 160 has portions which are part of a control path for a frequency-locked loop during normal mode reception, and a control path for the demodulator oscillator 120 in a start-up or no-carrier mode. A first frequency divider 80 receives an output signal from the PLL oscillator 120, and feeds that divided frequency signal to one input of a comparator 70. The other input of comparator 70 receives the divided frequency of a reference oscillator 90 and divider 100. The output signal of the comparator 70 is applied to an integrator 110 which generates the control voltage signal of the oscillator 30 in the automatic-frequency-controlled tuning loop.

The output of the comparator 70 is also connected to the input of a second integrator 160 whose output is a control signal connected to the second input of adder 150. It will be clear, rather than having two integrators 110 and 160, the single integrator 110 could be used as shown in broken lines.

The operation of the receiver according to the invention requires no switching between modes. In the absence of an incoming carrier signal (i.e. the start-up mode) the mixer 20 has no useful signal output, so that the output of the intermediate frequency filter 50 is zero, and therefore the output of the gain controlled amplifier 60 and the mixer 130 are also zero. The phase-locked-loop demodulator, formed by the voltage controlled oscillator 120, mixer 130, and loop filter 140 is thus disabled. As a result, a different phase locked loop is formed by the comparator 70, integrator 160, adder 150, oscillator 120 and divider 80. This start-up loop causes the oscillator 120 to be locked at the frequency of the reference oscillator 90 or at a frequency related to that oscillator frequency by the ratio of the dividers 80 and 100. The oscillator 90 and the dividers will have values chosen such that the oscillator 120 is in fact held at a frequency $F_I$ which is the center frequency of the intermediate frequency filter 50.

At the same time, the DC control voltage supplied from integrator 110, as compensated by a properly chosen DC tuning voltage, causes tuning oscillator 30 to operator at a frequency sufficiently close to a desired RF carrier frequency, so that upon receipt of a wanted carrier the mixer 20 will produce an intermediate frequency signal falling within the pass-band of IF filter 50. Those of ordinary skill in the art would understand that, if necessary, a selected tuning voltage may be added to the DC control voltage to bring the output of the oscillator 30 to the frequency related to the desired channel.

Upon appearance of a carrier signal falling within the frequency capture range, at the input of the amplifier 10, a signal within the pass-band of the filter 50 will be amplified through the intermediate filter amplification stages and arrive at mixer 130. The phase locked loop 120-150 will then operate to pull the oscillator 120 toward the frequency of the IF signal being provided by the gain controlled amplifier 60 to the mixer 130. Thus the VCO 120 frequency will deviate increasingly from $F_I$. This deviation of the frequency of the oscillator 120 will cause a change in the DC frequency control voltage appearing at the output of comparator 70. This voltage is then passed through integrator 110 to tuning oscillator 30. Thus integrator 110 acts as part of an automatic frequency control loop to vary the tuning frequency of oscillator 30 such that the intermediate frequency carrier signal passing through the amplifiers 40 and 60 is shifted to the center value $F_I$ of the IF filter pass-band.

Because of the low-pass filter effect of integrator 110, frequency modulating signals imposed on the carrier signal received by amplifier 10 do not affect the output of the tuning oscillator 30, while at the same time the phase locked loop demodulator 120-140, closed through the adder 150, provides an output voltage from loop amplifier 140 which is the desired demodulated signal.

What is claimed:

1. An FM receiver comprising a channel selection and intermediate frequency circuit having a signal output, a phase-locked loop frequency demodulator connected to said signal output and including a demodulator oscillator, and a return path from the demodulator to the channel selection circuit, said return path forming part of a frequency-locked loop for a tuning oscillator of the selection and intermediate frequency circuit, characterized by comprising a voltage correction stage having two outputs, said stage comprising a reference oscillator, at least one integrator, a comparator for comparing signals supplied from said demodulator oscillator with a signal supplied from said reference oscillator, and an adder, said comparator having an output supplied to said at least one integrator, said at least one integrator having an output connected to an input of said tuning oscillator and forming part of said frequency-locked loop for the tuning oscillator, and said at least one integrator having an output connected to said adder, and said adder being connected in said phase-locked loop for adding the output of the demodulator and the output of said at least one integrator, and having an output connected to a control input of said demodulator oscillator.

2. A receiver as claimed in claim 1, characterized in that said at least one integrator comprises first and second integrators, each having a respective output, the output of said first integrator being connected to said input of said tuning oscillator, and the output of said second integrator being connected to an input of said adder.

* * * * *